(12) United States Patent
Yim et al.

(10) Patent No.: US 10,699,760 B2
(45) Date of Patent: Jun. 30, 2020

(54) SEMICONDUCTOR SYSTEM, SEMICONDUCTOR CHIP, AND SEMICONDUCTOR MEMORY SYSTEM INCLUDING THE SEMICONDUCTOR SYSTEM

(71) Applicant: SK hynix Inc., Icheon-si, Gyeonggi-do (KR)

(72) Inventors: Hyuck Sang Yim, Seoul (KR); Ki Won Lee, Cheongju-si (KR); Seoung Ju Chung, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/203,351

(22) Filed: Nov. 28, 2018

(65) Prior Publication Data

US 2019/0333555 A1 Oct. 31, 2019

(30) Foreign Application Priority Data

Apr. 26, 2018 (KR) ........................ 10-2018-0048725

(51) Int. Cl.
| | | |
|---|---|---|
| *G11C 8/18* | (2006.01) | |
| *G11C 8/06* | (2006.01) | |
| *G11C 8/20* | (2006.01) | |
| *G11C 7/10* | (2006.01) | |
| *G11C 8/12* | (2006.01) | |

(52) U.S. Cl.
CPC ............. *G11C 8/06* (2013.01); *G11C 7/1039* (2013.01); *G11C 7/1072* (2013.01); *G11C 8/12* (2013.01); *G11C 8/18* (2013.01); *G11C 8/20* (2013.01)

(58) Field of Classification Search
CPC ........... G11C 8/06; G11C 8/20; G11C 7/1072; G11C 8/12; G11C 7/1039; G11C 8/18; G11C 2029/2602; G11C 2029/0409; G11C 29/44; G11C 2213/76; G11C 13/0007; G11C 13/003; G11C 5/04; G11C 8/10
See application file for complete search history.

(56) References Cited

U.S. PATENT DOCUMENTS

| | | | |
|---|---|---|---|
| 8,208,326 B1* | 6/2012 | Solt ........................ | G11C 29/10 365/201 |
| 9,679,642 B2 | 6/2017 | Liu et al. | |
| 2009/0231947 A1* | 9/2009 | Lee .......................... | G11C 8/06 365/230.08 |
| 2011/0055645 A1* | 3/2011 | Inoue .................... | G06F 11/263 714/718 |
| 2017/0206030 A1 | 7/2017 | Woo et al. | |
| 2019/0333555 A1* | 10/2019 | Yim ........................ | G11C 8/06 |
| 2020/0027497 A1* | 1/2020 | Shin .................... | G11C 11/4087 |

\* cited by examiner

*Primary Examiner* — Khamdan N. Alrobaie
(74) *Attorney, Agent, or Firm* — William Park & Associates Ltd.

(57) ABSTRACT

A semiconductor system includes a first set of at least one semiconductor device, and a second set of at least one semiconductor device. The semiconductor system includes a control block for receiving an external address and providing the first and second sets of semiconductor devices with an internal address. The control block provides a semiconductor device from the first set with a first internal address corresponding to the external address, and the control block provides a semiconductor device from the second set with a second internal address that does not correspond to the external address.

18 Claims, 10 Drawing Sheets

FIG.5
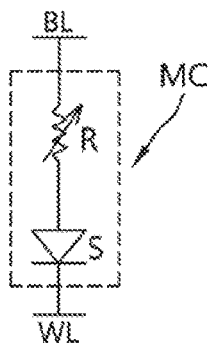
FIG.6
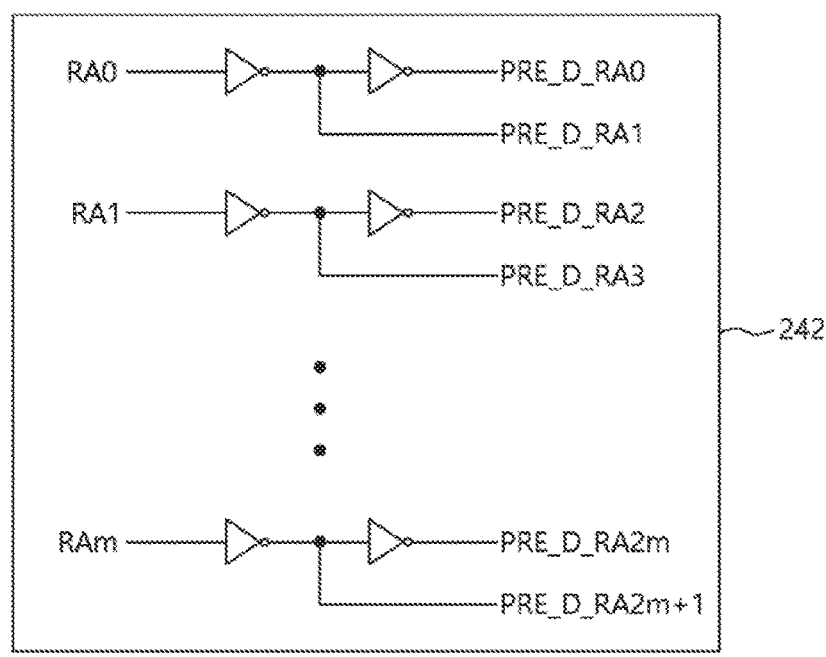
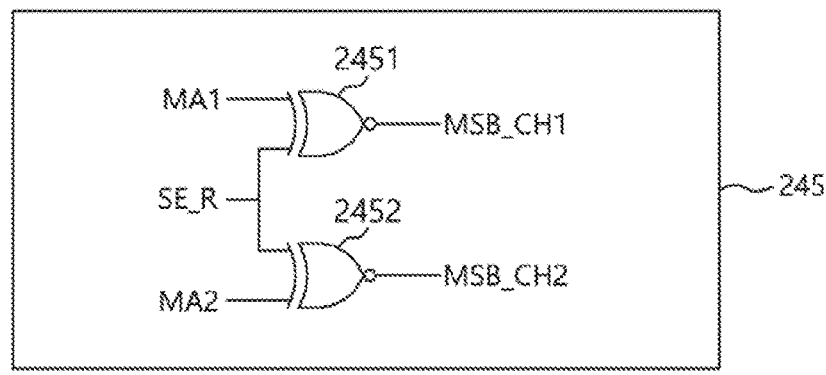

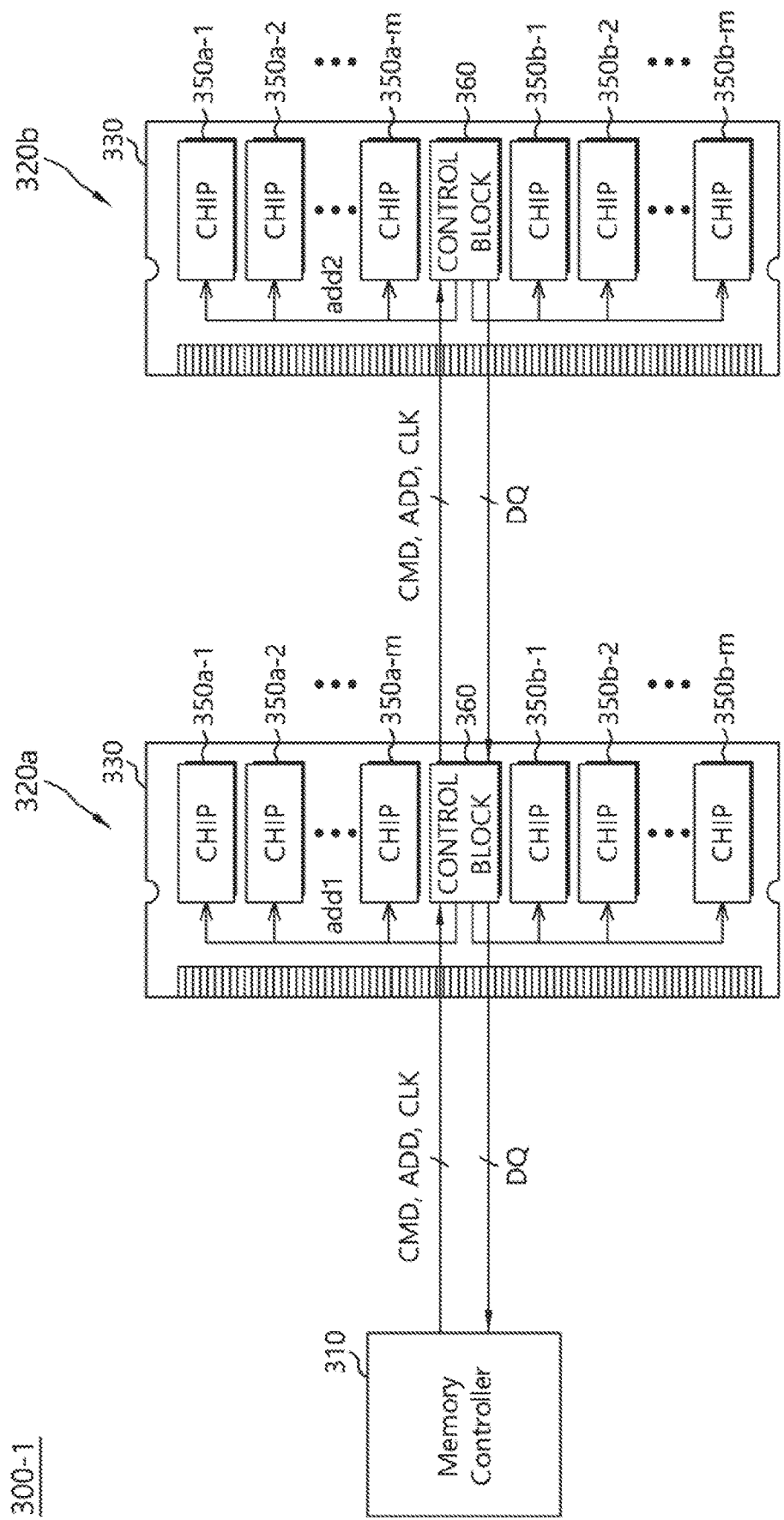

SEMICONDUCTOR SYSTEM, SEMICONDUCTOR CHIP, AND SEMICONDUCTOR MEMORY SYSTEM INCLUDING THE SEMICONDUCTOR SYSTEM

CROSS-REFERENCES TO RELATED APPLICATION

The present application claims priority under 35 U.S.C. § 119(a) to Korean application number 10-2018-0048725, filed on Apr. 26, 2018, in the Korean Intellectual Property Office, which is incorporated herein by reference in its entirety.

BACKGROUND

1. Technical Field

Various embodiments may generally relate to a semiconductor system, semiconductor chip, and a semiconductor memory system including the same, more particularly, to a semiconductor system which may be capable of improving a test yield, and a semiconductor memory system including the semiconductor system.

2. Related Art

Generally, a semiconductor memory device may include a plurality of memory cells. The memory cells may be classified into a plurality of groups. The memory cells may be controlled by the groups. The memory cell group may be referred to as a memory cell array or a mat. Control blocks may be arranged at boundaries between the memory cell arrays. The memory cell arrays may be separately controlled by the control blocks.

A difference of signal transmission characteristics may be generated between memory cells (hereinafter referred to as near cells) adjacent to the control block and memory cells (hereinafter referred to as far cells) remote from the control block in the memory cell array. Particularly, in a cross point array structure using a phase changeable material as a switching element and a storage medium, bit errors may be frequently generated in the near cell region.

Additionally, an error test process of the semiconductor integrated circuit device may be performed by a chip, a bank or a mat. The error test process may be simultaneously performed on the semiconductor chips, the banks and the mats. When the error test process is performed on the near cell region, an error ratio in the near cell region may be greatly increased compared to other regions, for example, a middle cell region or the far cell region. Although the errors in the near cell region might not be a concerned level in view of all of the chip, the bank and the mat, the instantaneous increasing of the error ratio may result in low yield of the semiconductor chip, the bank and the mat.

SUMMARY

In an example of an embodiment of the present disclosure, a semiconductor system may include a first set of at least one semiconductor device; a second set of at least one semiconductor device; and a control block for receiving an external address and providing the first and second sets of semiconductor devices with an internal address. The control block may provide a semiconductor device from the first set with a first internal address corresponding to the external address, and the control block provides a semiconductor device from the second set with a second internal address that does not correspond to the external address.

In an example of an embodiment of the present disclosure, a semiconductor system may include a first mat and a second mat and first and second control circuit blocks. Each of the first and second mats may include first to fourth sub-mats arranged in a separately controlled matrix. Each of the first to fourth sub-mats may include a plurality of word lines, a plurality of bit lines intersected with the word lines, and memory cells formed between the word lines and the bit lines. The first control circuit block is arranged between the first to fourth sub-mats of the first mat to output an internal address for selecting any one of the memory cells in the first to fourth sub-mats in response to an external address. The second control circuit block is arranged between the first to fourth sub-mats of the second mat to output the internal address for selecting any one of the memory cells in the first to fourth sub-mats in response to the external address. The first and second control circuit blocks are configured to provide the first and second mats, respectively, with a first internal address, or the first control circuit block is configured to provide the first mat with the first internal address and the second control circuit block is configured to provide the second mat with a second internal address different from the first internal address.

In an example of an embodiment of the present disclosure, a semiconductor chip may include a bank controller; a first bank group including a plurality of banks arranged at a first side of the bank controller; and a second bank group including a plurality of banks arranged at a second side of the bank controller opposite to the first side. The bank controller may provide the first and second bank groups with a bank address for selecting any one of the banks or provides the first bank group with the bank address and the second bank group with a scramble bank address different from the bank address.

In an example of an embodiment of the present disclosure, a semiconductor memory system may include a memory controller and a memory module. The memory module may be interfaced with the memory controller. The memory module may include a plurality of semiconductor chips and a control block for managing the semiconductor chips. The control block may generate first and second internal addresses for selecting symmetrically arranged memory cells of the semiconductor chip in response to an external address inputted from the memory controller. The control block may provide a first part of the semiconductor chips in the memory module with the first internal address. The control block may provide a second part of the semiconductor chips in the memory module with the second internal address.

In an example of embodiments of the present disclosure, a semiconductor memory system may include a memory controller and first and second memory modules. The first and second memory modules may be interfaced with the memory controller. The first and second memory modules may include a plurality of semiconductor chips. The first memory module may include a first control block for managing the semiconductor chips on the first memory module. The first control block may generate a first internal address for directing a memory cell of the semiconductor chip corresponding to an external address inputted from the memory controller. The first control block may transmit the first internal address to the semiconductor chip of the first memory module. The second memory module may include a second control block for managing the semiconductor chips on the second memory module. The second control block may generate a second internal address for directing an inverted position of the external address inputted from the memory controller. The second control block may transmit the second internal address to the semiconductor chip of the second memory module.

BRIEF DESCRIPTION OF THE DRAWINGS

FIG. 5 is a circuit diagram illustrating a memory cell in accordance with an example of an embodiment;

FIG. 6 is a view illustrating a row predecoder in accordance with an example of an embodiment;

FIG. 15 is a view illustrating a semiconductor memory system in accordance with an example of an embodiment.

DETAILED DESCRIPTION

Various embodiments will be described with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments. However, embodiments of the present disclosure should not be construed as limiting the concepts. Although a few embodiments of the present disclosure will be shown and described, it will be appreciated by those of ordinary skill in the art that changes may be made in these embodiments without departing from the principles and spirit of the present disclosure.

Figure 1:
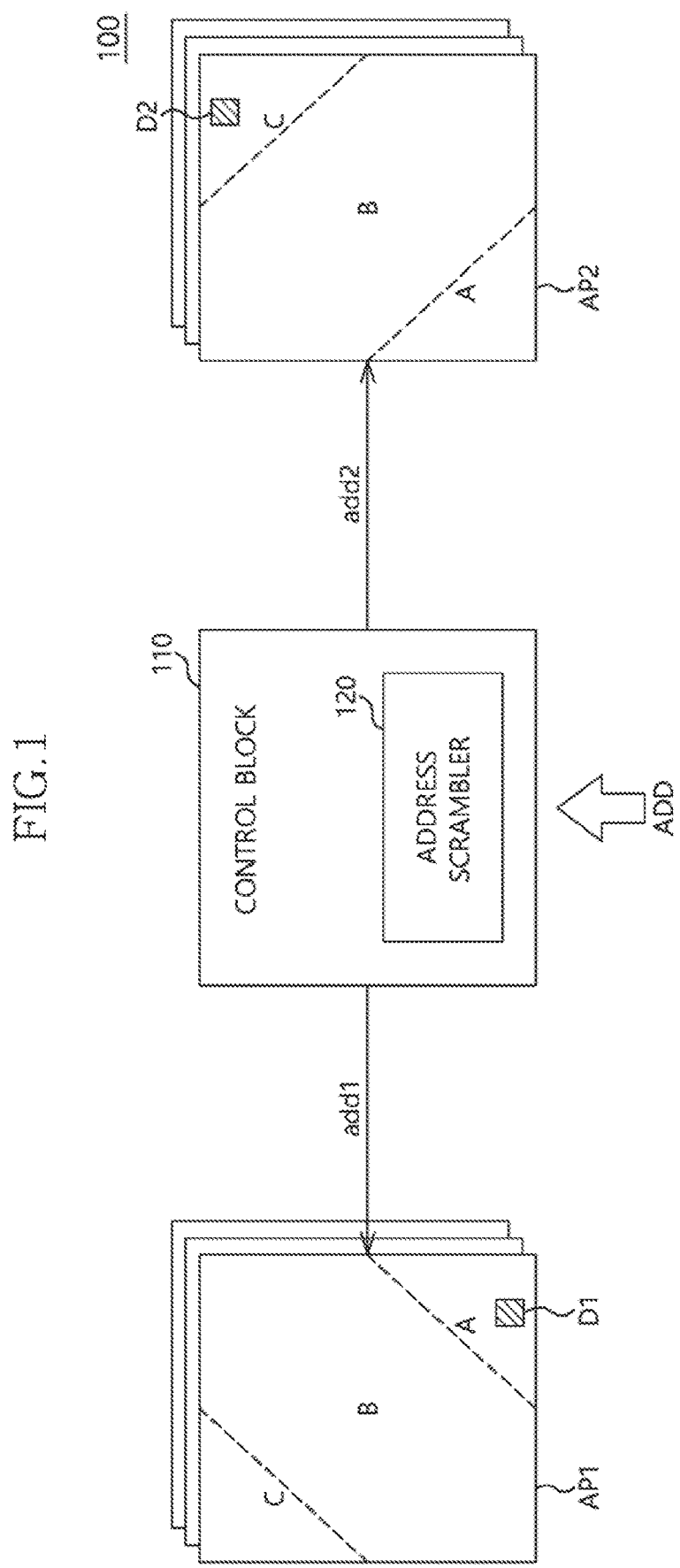
FIG. 1 is a view illustrating a semiconductor system in accordance with an example of an embodiment.

FIG. 1 is a view illustrating a semiconductor system in accordance with an example of an embodiment.

Referring to FIG. 1, a semiconductor system 100 of this example of an embodiment may include a control block 110 and first and second semiconductor devices AP1 and AP2. In an embodiment, the first and second semiconductor devices AP1 and AP2 may be substantially the same kind of semiconductor device. For example, each of the first and second semiconductor devices AP1 and AP2 may include a mat including a plurality of sub-mats, a bank including a plurality of mats, a semiconductor chip including a plurality of banks or a module including a plurality of semiconductor chips. In some embodiments, there may be a first set of at least one semiconductor device AP1 and a second set of at least one semiconductor device AP2.

Each of the first and second semiconductor devices AP1 and AP2 may include a first region A, a second region B and a third region C. For example, the first region A may be adjacent to the control block 110. An error generation frequency may be high in the first region A. The third region C may be remote from the control block 110. The error generation frequency may be low in the third region C. The error generation frequency in the second region B may be lower than that in the first region A and higher than that in the third region C.

The control block 110 may receive an external address ADD from a processor (not shown). The control block 110 may generate first and second internal addresses add1 and add2 for selecting any one of elements D (i.e., D1 and D2) in the first and second semiconductor devices AP1 and AP2. The control block 110 may include an address scrambler 120 for generating the first internal address adds corresponding to the external address ADD, and the second internal address add2 that might not correspond to the external address ADD. The element may be a memory cell, a mat, a bank or a chip.

For example, when a physical address in accordance with the external address ADD corresponds to the first region A, the address scrambler 120 may provide the first semiconductor device AP1 with the first internal address add1 corresponding to the physical address. Simultaneously, the address scrambler 120 may provide the second semiconductor device AP2 with the second internal address add2 that might not correspond to the physical address. For example, the second internal address add2 may correspond to a position arranged by inverting the first internal address add1. That is, when an element D1 of the first region A in the first semiconductor device AP1 is selected by the first internal address add1, an element D2 of the third region C in the second semiconductor device AP2 may be selected by the second internal address add2.

Figures 2A, 2B, 2C:
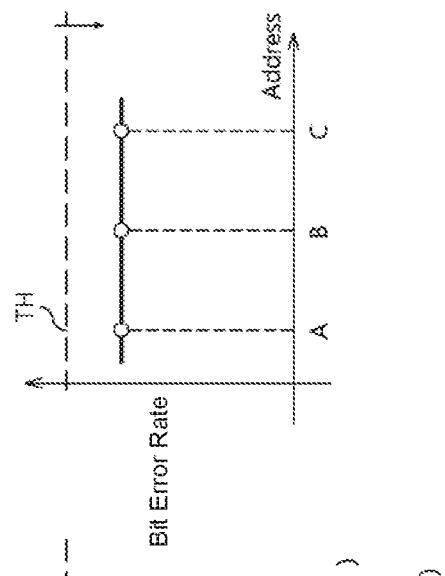
FIGS. 2A, 2B, and 2C are graphs showing bit error rate (BER) results in accordance with positions of a semiconductor device.

FIGS. 2A to 2C are graphs showing bit error rate (BER) results in accordance with positions of a semiconductor device.

FIG. 2A may represent BER results of the first semiconductor device AP1 into which the first internal address add1 is inputted. The BER of the first semiconductor device AP1 may be gradually decreased from the first region A to the third region C through the second region B.

FIG. 2B may represent BER results of the second semiconductor device AP2 into which the second internal address add2 is inputted. As mentioned above, in an error test process, the second internal address add2 generated by inverting the first internal address add1 may be inputted into the second semiconductor device AP2. Thus, when the first region A of the first semiconductor device AP1 having the high error generation frequency is selected, the third region C of the second semiconductor device AP2 having the low error generation frequency may be selected. Although an external address may sequentially select the first region A, the second region B and the third region C in the second semiconductor device AP2 in the error test process, the third region C, the second region B and the first region A in the second semiconductor device AP2 may be actually selected. Therefore, the BER of the second semiconductor device AP2 may be gradually increased from the first region A to the third region C through the second region B based on the external address.

FIG. 2C may represent scrambling results of the first and second semiconductor devices AP1 and AP2. The error generation frequency in the first region A of the first semiconductor device AP1 may be relatively high. In contrast, the error generation frequency in the first region (actually, the third region) of the second semiconductor device AP2 may be relatively low. Thus, when the BER results of the first and second semiconductor devices AP1 and AP2 are scrambled, an average BER of the first and second semiconductor devices AP1 and AP2 may be decreased to the BER of the second region B.

Therefore, although the errors may be concentratedly generated in a specific region, the error generation frequency might not be temporarily increased above a critical value TH. As a result, a normal semiconductor device might not be classified to be abnormal.

Figure 3:
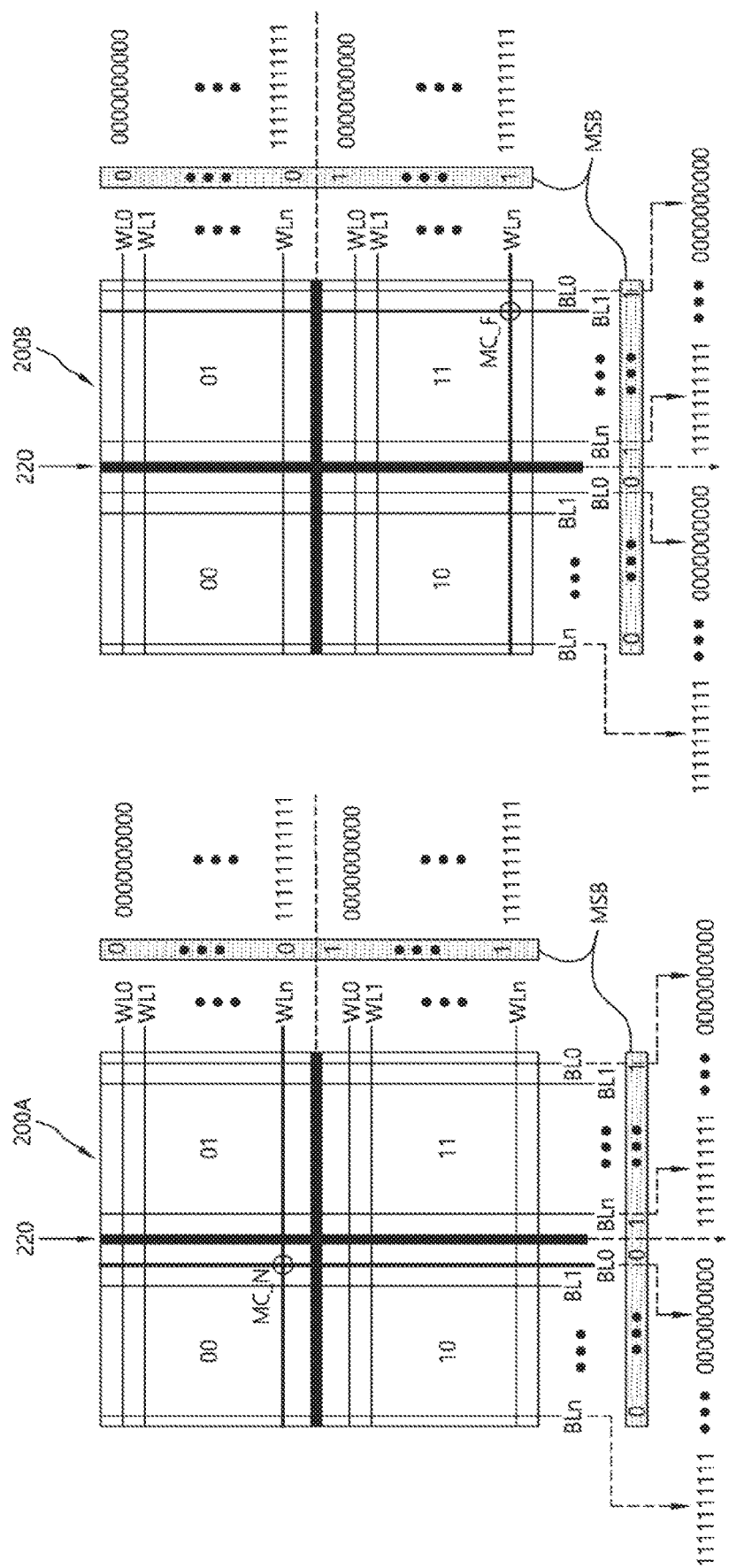
FIG. 3 is a plan view illustrating a plurality of mats in accordance with an example of an embodiment.

FIG. 3 is a plan view illustrating a plurality of mats in accordance with an example of an embodiment.

Referring to FIG. 3, each of a first mat 200A and a second mat 200B may include a plurality of sub-mats 00, 01, 10 and 11 and a control circuit block 220. In some embodiments, the first mat 200A may have a first control circuit block (i.e., 220 of 200A) and the second mat 200B may have a second control circuit block (i.e., 220 of 200B).

The sub-mats 00, 01, 10 and 11 may be arranged in a matrix shape. The control circuit block 220 may be arranged between the sub-mats 00, 01, 10 and 11. Each of the sub-mats 00, 01, 10 and 11 may include a plurality of word lines WL0~WLn and a plurality of bit lines BL0~BLn.

In an example of an embodiment, the sub-mats may include the $2^{10}$ word lines WL0~WLn and the $2^{10}$ bit lines BL0~BLn. That is, address bit information of the word lines and the bit lines in the mats 200A and 200B may be represented as 00000000000~11111111111, i.e., 11 binary bits, respectively. Each of the mats 200A and 200B may be classified into the upper sub-mat 00 and 01 and the lower sub-mat 10 and 11 through an uppermost bit MSB (most significant byte: hereinafter, referred to as an uppermost row address bit) among the address bit information of the word line.

Each of the mats 200A and 200B may be classified into the left sub-mat 00 and 10 and the right sub-mat 01 and 11 through an uppermost bit MSB (hereinafter, referred to as an uppermost column address bit) among the address bit information of the bit line.

For example, when word line activation address information directs "00000000000", the first word line WL0 of the upper sub-mat 00 and 01 may be selected. When the word line activation address information may direct "10000000000", the first word line WL0 of the lower sub-mat 10 and 11 may be selected.

Figure 4:
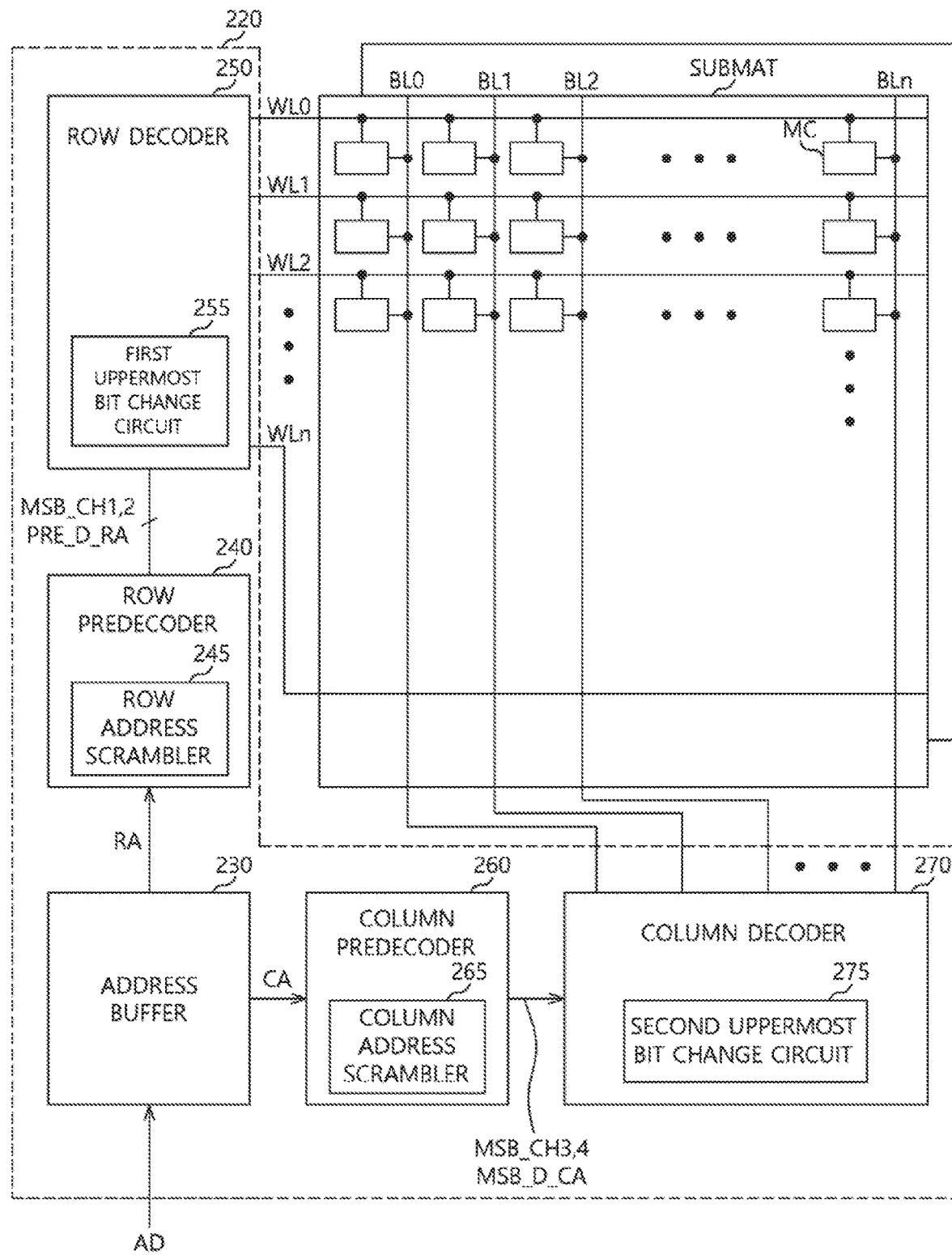
FIG. 4 is a block diagram illustrating a unit mat and a control circuit block in accordance with an example of an embodiment.

FIG. 4 is a block diagram illustrating a unit mat and a control circuit block in accordance with an example of an embodiment, and FIG. 5 is a circuit diagram illustrating a memory cell in accordance with an example of an embodiment.

Referring to FIG. 4, the sub-mat SUBMAT may include a plurality of word lines WL0~WLn, a plurality of bit lines BL0~BLn and memory cells MC.

The word lines WL0~WLn and the bit lines BL0~BLn may be intersected with each other. The memory cells MC may be arranged at intersected points between the word lines WL0~WLn and the bit lines BL0~BLn.

Referring to FIG. 5, the memory cell MC may include a variable resistance R and a selection element S connected between the bit line BL and the word line WL. The variable resistance R may have resistance state changed by a current amount, which may be generated by an electrical pulse applied to the bit line BL. For example, the variable resistance R may include a phase changeable layer having crystalline state changed by a current amount or a resistance changeable layer. The phase changeable layer may include GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb(SeTe), $Te_{81}Ge_{15}Sb_2S_2$, etc.

The phase changeable layer may have an amorphous state having a relatively high resistance and a crystalline state having a relatively low resistance. The phases of the phase changeable layer may be changed by Joule's heat generated by the current amount and a cooling time.

Each of the memory cells MC may be a single level cell for storing 1 bit of data. In this case, the memory cell MC may have two resistance distributions in accordance with stored data. Alternatively, each of the memory cells MC may be a multi level cell for storing no less than 2 bits of data. In this case, the memory cell MC may have four or eight resistance distributions in accordance with stored data.

The selection element S may include a switch such as a diode. Alternatively, the selection element S may include a transistor or an Ovonics threshold switch (OTS) including a phase changeable material.

Referring again to FIG. 4, the control circuit block 220 may include an address buffer 230, a row predecoder 240, a row decoder 250, a column predecoder 260 and a column decoder 270.

The address buffer 230 may receive a logical address AD from a controller (not shown). The address buffer 230 may buffer the logical address AD to generate a row address RA and a column address CA. The row address RA and the column address CA may be inputted into the row predecoder 240 and the column predecoder 260, respectively.

FIG. 6 is a view illustrating a row predecoder in accordance with an example of an embodiment.

Referring to FIG. 6, the row predecoder 240 may include a predecoding signal generating circuit 242 and a row address scrambler 245.

The predecoding signal generation circuit 242 may include a plurality of inverters. The predecoding signal generation circuit 242 may invert and buffer a row address RA<0:m> to generate a plurality of predecoding signals PRE_D_RA<0:2m+1>. Each row address RA0~RAm may be inputted an inverter chain including two inverters which are connected in series. For example, a first row address is inputted to a first inverter chain to generate a first predecoding signal PRE_D_RA0 and a second predecoding signal PRE_D_RA1. The first predecoding signal PRE_P_RA0 is generated at an output node of a first inverter of the first inverter chain. The second predecoding signal PRE_D_RA1 is generated at an output node of a second inverter of the first inverter chain.

The row address scrambler 245 may be configured to change selection of the upper sub-mat and the lower sub-mat in a selected mat. The row address scrambler 245 may receive a first mat selection signal MA1, a second mat selection signal MA2 and a row scramble enable signal SE_R to generate MSB change signals MSB_CH1 and MSB_CH2. For example, the first mat selection signal MA1 may be a signal for selecting the first mat 200A. The second mat selection signal MA2 may be a signal for selecting the second mat 200B. The row scramble enable signal SE_R may be an arbitrary row address bit.

The row address scrambler 245 may include a first XNOR gate 2451 and a second XNOR gate 2452. The first XNOR gate 2451 may receive the first mat selection signal MA1 and the row scramble enable signal SE_R to generate the first MSB change signal MSB_CH1. The second XNOR gate 2452 may receive the row scramble enable signal SE_R and the second mat selection signal MA2 to generate the second MSB change signal MSB_CH2.

Hereinafter, operations of the row predecoder 240 including the row address scrambler 245 and the row decoder 250 is illustrated and discussed.

Under conditions that any one of the first mat 200A and the second mat 200B may be selected, the first mat selection signal MA1 may have a level different from that of the row scramble enable signal SE_R and the second mat selection signal MA2 may have a level substantially the same as that of the row scramble enable signal SE_R.

Because the first mat selection signal MA1 and the row scramble enable signal SE_R may have the different levels, the first XNOR gate 2451 may output the first MSB change signal MSB_CH1 disabled to a low level. Because the first MSB change signal MSB_CH1 may be disabled, the row decoder 250 may output a normal word line activation signal corresponding to the row address RA to the first mat 200A.

Because the second mat selection signal MA2 and the row scramble enable signal SE_R may have substantially the same level, the second XNOR gate 2452 may output the second MSB change signal MSB_CH2 enabled to a high level. Because the second MSB change signal MSB_CH2 may be enabled, the row decoder 250 may receive the second MSB change signal MSB_CH2 and may invert an uppermost bit of a word line activation signal corresponding to the row address RA in response to the second MSB change signal MSB_CH2. The row decoder 250 may then output the inverted uppermost bit of a word line activation signal to the second mat 200B.

In an example of an embodiment, the row scramble enable signal SE_R may use one of the row addresses. Alternatively, the row scramble enable signal SE_R may be generated from a row scramble enable signal generation circuit.

Figure 7:
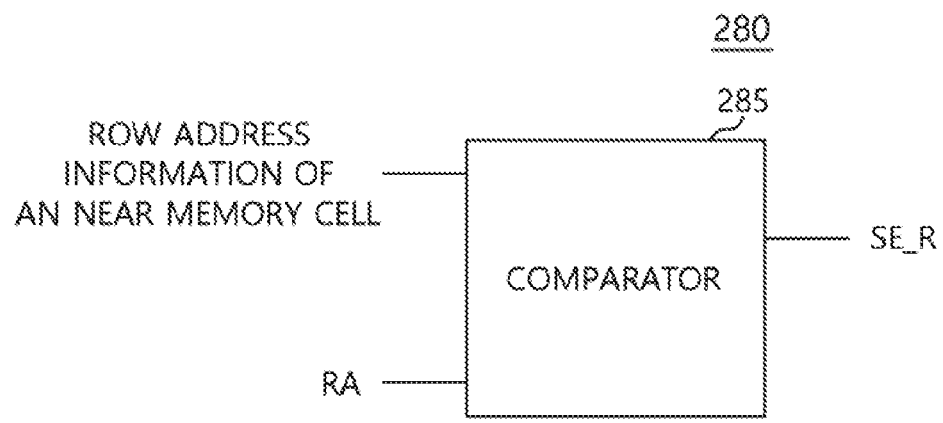
FIG. 7 is a block diagram illustrating a row scramble enable signal generation circuit in accordance with an example of an embodiment.

FIG. 7 is a block diagram illustrating a row scramble enable signal generation circuit in accordance with an example of an embodiment.

Referring to FIG. 7, the row scramble enable signal generation circuit 280 may include a comparator 285 for comparing row address information of a near memory cell with the row address RA outputted from the address buffer 230. The comparator 285 may compare memory cell information, particularly, the row address information of the near memory cell with the row address RA inputted from the address buffer 230 to generate the enabled row scramble enable signal SE_R, when the row address RA inputted from the address buffer 230 is within a row address range for selecting the near memory cells. Further, the comparator 285 may include general comparison circuits. The near memory cell information may be stored in the controller. The row scramble enable signal generation circuit 280 may be provided in the control circuit block 220.

Figure 8:
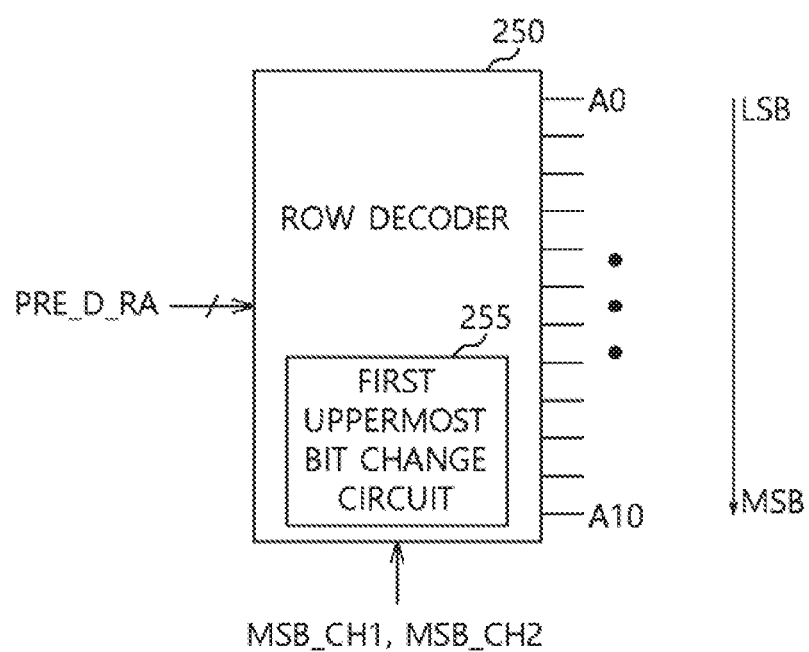
FIG. 8 is a view illustrating a row decoder in accordance with an example of an embodiment.

FIG. 8 is a view illustrating a row decoder in accordance with an example of an embodiment.

Referring to FIG. 8, the row decoder 250 may receive the predecoding signal PRE_D_RA and the first and second MSB change signals MSB_CH1 and MSB_CH2 to generate word line activation address with binary bits A0~A10.

The row decoder 250 may include a first uppermost bit change circuit 255. The first uppermost bit change circuit 255 may selectively invert the uppermost bit A10 among the binary bits of the word line activation address in response to the first MSB change signal MSB_CH1 or the second MSB change signal MSB_CH2.

For example, when a (n+1)th word line WLn of the upper sub-mat 00 and 01 should be activated by the normal row address (for example, physical address) and the first MSB change signal MSB_CH1 is disabled, the row decoder 250 may output the word line activation address corresponding to the normal row address RA (01111111111) to the first mat 200A.

Meanwhile, when the second MSB change signal MSB_CH2 enabled, the row decoder 250 may output the world line activation address (11111111111) with a changed uppermost bit A10 as the word line activation address bit A0~A10 to the second mat 200B, comparing with the normal row address RA (01111111111).

Therefore, the (n+1) word line WLn on the upper sub-mat 00 and 01 of the first mat 200A may be selected and the (n+1) word line WLn on the lower sub-mat 10 and 11 of the second mat 200B may be selected.

The column predecoder 260 may have configurations substantially similar to those of the row predecoder 240. The column predecoder 260 may include a column predecoding signal generation circuit and a column address scrambler 265. The column predecoding signal generation circuit may have configurations substantially the same as those of the row predecoding signal generation circuit 242. Thus, any further illustrations with respect to the configurations and operations of the column predecoding signal generation circuit may be omitted herein for brevity.

Figure 9:
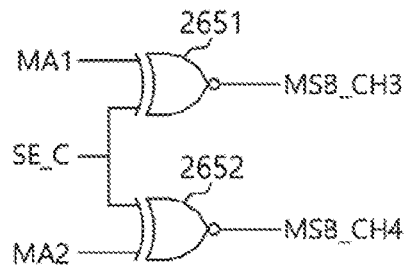
FIG. 9 is a view illustrating a column address scrambler in accordance with an example of an embodiment.

FIG. 9 is a view illustrating a column address scrambler in accordance with an example of an embodiment.

Referring to FIG. 9, the column address scrambler 265 may change positions of the left and right sub-mats in a selected mat.

The column address scrambler 265 may receive the first mat selection signal MA1, the second mat selection signal MA2 and a column scramble enable signal SE_C to generate MSB change signals MSB_CH3 and MSB_CH4. For example, the column scramble enable signal SE_C may be an arbitrary address bit for determining the left sub-mat 00 and 10 and the right sub-mat 01 and 11.

The column address scrambler 265 may include a third XNOR gate 2651 and a fourth XNOR gate 2652.

The third XNOR gate 2651 may receive the first mat selection signal MA1 and the column scramble enable signal SE_C to generate the third MSB change signal MSB_CH3.

The fourth XNOR gate 2652 may receive the column scramble enable signal SE_C and the second mat selection signal MA2 to generate the fourth MSB change signal MSB_CH4.

The first mat selection signal MA1 may have a level different from that of the column scramble enable signal SE_C and the second mat selection signal MA2 may have a level substantially the same as that of the column scramble enable signal SE_C.

Because the first mat selection signal MA1 and the column scramble enable signal SE_C may have the different levels, the third XNOR gate 2651 may output the third MSB change signal MSB_CH3 disabled to a low level. Because the third MSB change signal MSB_CH3 may be disabled, the column decoder 270 may output a normal bit line activation signal corresponding to the column address CA to the first mat 200A.

Because the second mat selection signal MA2 and the column scramble enable signal SE_C may have substantially the same level, the fourth XNOR gate 2652 may output the fourth MSB change signal MSB_CH4 enabled to a high level. Because the fourth MSB change signal MSB_CH4 may be enabled, the column decoder 270 may invert an uppermost bit of a bit line activation signal corresponding to the column address CA in response to the fourth MSB change signal MSB_CH4. The column decoder 270 may then output the inverted signal to the second mat 200B.

In example embodiments, the column scramble enable signal SE_C may use one of the column addresses. Alternatively, the column scramble enable signal SE_C may be generated from a column scramble enable signal generation circuit.

Figure 10:
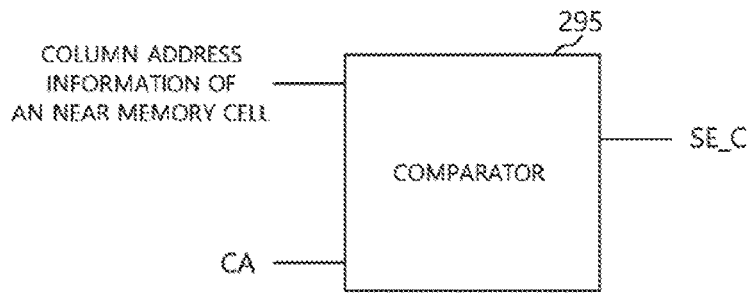
FIG. 10 is a block diagram illustrating a row scramble enable signal generation circuit in accordance with an example of an embodiment.

FIG. 10 is a block diagram illustrating a row scramble enable signal generation circuit in accordance with an example of an embodiment.

Referring to FIG. 10, the column scramble enable signal generation circuit 290 may include a comparator 295 for comparing column address information of a near memory cell with the column address CA outputted from the address buffer 230. The comparator 295 may generate the enabled column scramble enable signal SE_C when the column address CA inputted from the address buffer 230 may be within a column address range for selecting the near memory cells. Further, the comparator 295 may include general comparison circuits. The near memory cell information may be stored in the controller. The column scramble enable signal generation circuit 290 may be provided in the control circuit block 220.

Figure 11:
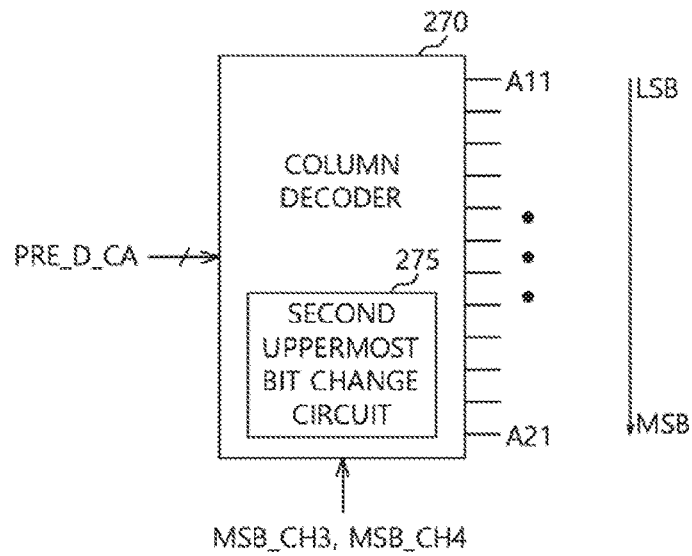
FIG. 11 is a view illustrating a column decoder in accordance with an example of an embodiment.

FIG. 11 is a view illustrating a column decoder in accordance with an example of an embodiment.

Referring to FIG. 11, the column decoder 270 may receive a plurality of predecoding signals PRE_D_CA and the third and fourth MSB change signals MSB_CH3 and MSB_CH4 to generate bit line activation address with binary bits A11~A21. In example embodiments, the binary bits of the bit line activation address may be represented by A11~A21. However, various address bits may be used as the binary bits of the bit line activation address.

The column decoder 270 may include a second uppermost bit change circuit 275. The second uppermost bit change circuit 275 may selectively invert the uppermost bit A21 among the binary bits of the bit line activation address bits in response to the third MSB change signal MSB_CH3 or the fourth MSB change signal MSB_CH4.

For example, when a first bit line BL0 of the left sub-mat 00 and 10 should be activated and the third MSB change signal MSB_CH3 is disabled, the column decoder 270 may output the bit line activation address with the binary bits A11~A21 corresponding to the normal column address CA (00000000000) to the first mat 200A.

Meanwhile, when the fourth MSB change signal MSB_CH4 may be enabled, the column decoder 270 may output the bit line activation address (10000000000) with a changed uppermost bit A21 as the bit line activation address bit A11~A21 to the second mat 200B comparing with the normal column address CA (00000000000).

Therefore, the first bit line BL0 on the left sub-mat 00 and 10 of the first mat 200A may be selected and the first bit line BL0 on the right sub-mat 01 and 11 of the second mat 200B may be selected.

Thus, the (n+1)th word line WLn passing through the upper sub-mat 00 and 01 corresponding to the logical address and the first bit line BL0 passing through the left sub-mat 00 and 10 may be selected in the first mat 200A. In the first mat 200A, the near memory cell MC_N located at an intersected point between the (n+1)th word line WLn adjacent to the control circuit block 220 and the first bit line BL0 of the left sub-mat 00 and 10 may be selected.

In the second mat 200B, the (n+1)th word line WLn passing through the lower sub-mat 10 and 11 and the first bit line BL0 passing through the right mat 01 and 11 may be selected by driving the row address scrambler 245 and the column address scrambler 265. That is, the far cell MC_F located at the intersected point between the (n+1)th word line WLn passing the lower sub-mat 10 and 11 and the first bit line BL0 passing through the right mat 01 and 11 may be selected in the second mat 200B, to compensate the BER (bit error rate).

Generally, the BER test for determining performances may be simultaneously performed on the plurality of mats. Further, the BER test may be simultaneously performed on a memory cell which located at the same position of each mat.

In an example of an embodiment, when a near memory cell adjacent to the control circuit block 220 in which a fail probability is high is batch tested, the row address scrambler 245 of the row predecoder 240 and the column address scrambler 265 of the column predecoder 260 may be driven.

Therefore, the near memory cell of a part of the mats may be normally tested. In contrast, the far memory cell of a part of the mats, which may be inverted in the upward, downward, left and right directions may be selected and tested by driving the row address scrambler 245 and the column address scrambler 265.

According to examples of the embodiments, when the address scramble operation is performed on a part of the mats, the BER of the near memory cell MC_N and the BER of the far memory cell MC_F may be compensated with each other in the BER test. Thus, the BER of the embodiment may be adjusted to an average value between the BER obtained by testing the near memory cell MC_N and the BER ratio obtained by testing the remote memory cell MC_F (See FIG. 2C). As a result, the BER might not be greatly increased in testing a specific region so that a yield of the semiconductor chip may be remarkably improved.

In an example of an embodiment, the address scramble process may be performed by the mats. Alternatively, the address scramble process may be performed on the banks.

Figure 12:
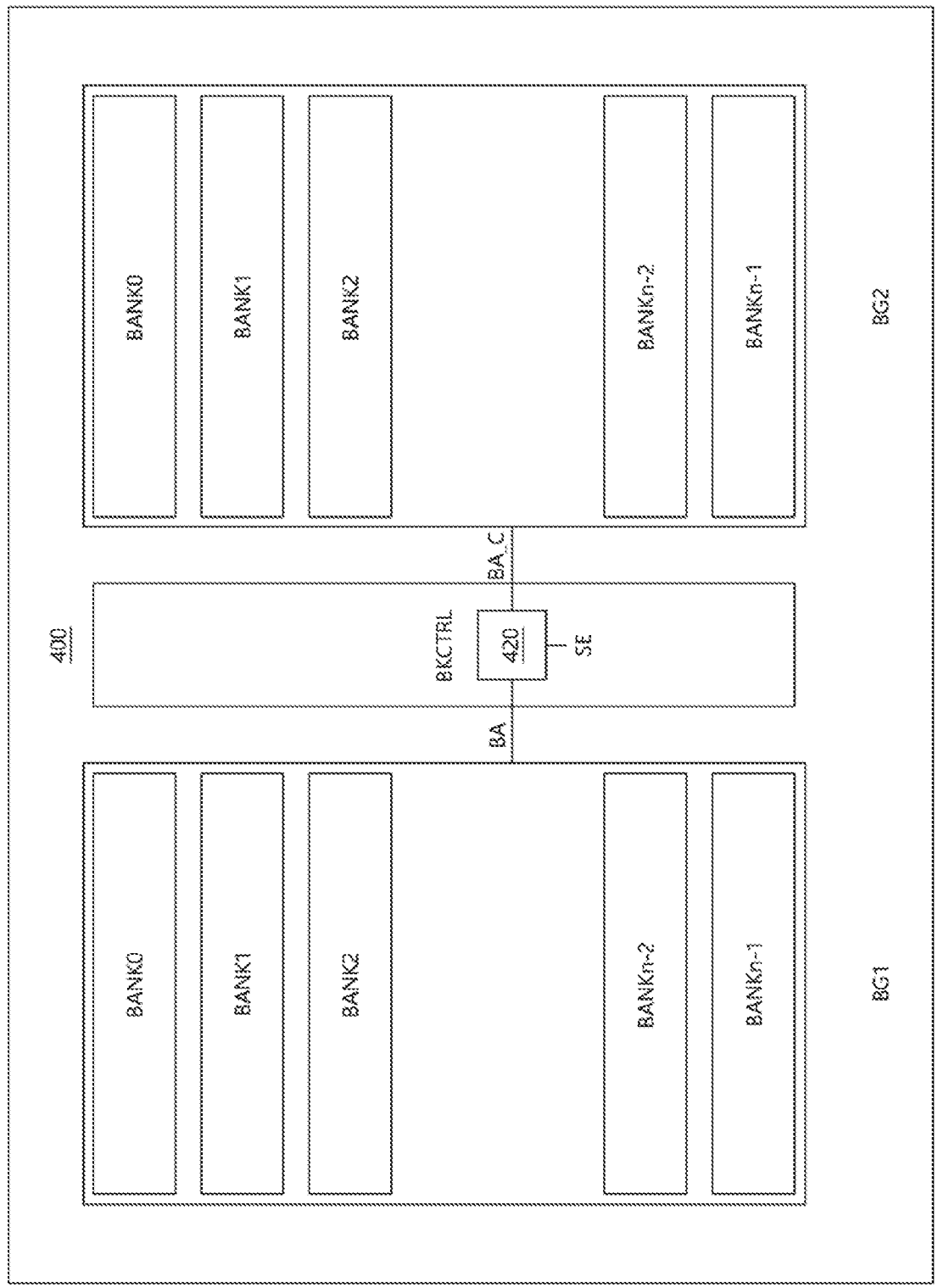
FIG. 12 is a plan view illustrating a semiconductor chip including a plurality of banks in accordance with an example of an embodiment.
Figure 13:
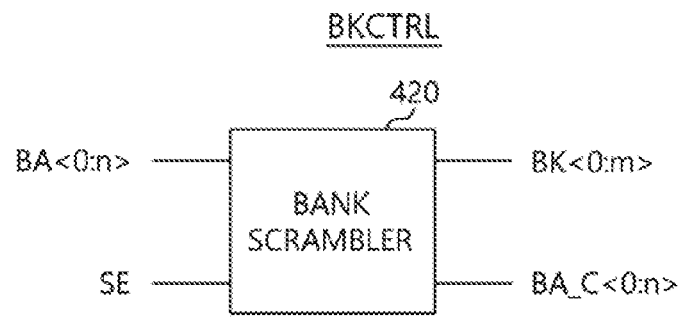
FIG. 13 is a block diagram illustrating a bank controller in accordance with an example of an embodiment.

FIG. 12 is a plan view illustrating a semiconductor chip including a plurality of banks in accordance with an example of an embodiment, and FIG. 13 is a block diagram illustrating a bank controller in accordance with an example of an embodiment.

Referring to FIG. 12, a semiconductor chip 400 may include a bank controller BKCTRL. The semiconductor chip 400 may be classified into a first bank group BG1 and a second bank group BG2. The first bank group BG1 may include banks BANK0~BANKn arranged at a first side of the bank controller BKCTRL. The second bank group BG2 may include banks BANK0~BANKn−1 arranged at a second side of the bank controller BKCTL opposite to the first side. For example, the first bank group BG1 and the second bank group BG2 may be classified into an uppermost bit MSB of a bank address BA<0:n>.

Referring to FIG. 13, the bank controller BKCTRL may include a bank scrambler 420. The bank scrambler 420 may output the bank address BA<0:m> in response to the bank address BA<0:n> and a scramble enable signal SE. Further, the bank scrambler 420 may output a scramble bank address BA_C<0:n> generated by inverting at least one bit among the bank address BA<0:n> in response to the bank address BA<0:n> and a scramble enable signal SE.

The scramble enable signal SE may be a signal generated by the scramble enable signal generation circuit 280 or 290 in FIGS. 7 and 10. For example, the scramble enable signal generation circuit may be in the bank controller BLCTRL. The scramble enable signal generation circuit may compare bank information having a high error frequency in the controller with the inputted bank address BA<0:n>. The bank information having the high error frequency may direct a bank adjacent to the bank controller BKCTRL. Alternatively, errors may be relatively more generated in the bank information having the high error frequency due to other reasons. When the bank address BA<0:n> corresponds to the bank information having the high error frequency, the scramble enable signal generation circuit may generate the scramble enable signal SE in response to the bank address BA<0:n>.

When the scramble enable signal SE is enabled, the bank scrambler 420 may invert at least one of the address bits of the bank address BA<0:n> to generate the scramble bank address BA_C<0:n>. In contrast, when the scramble enable signal SE is disabled, the bank scrambler 420 may output the bank address BA<0:n>. The bank scrambler 420 may be embodied by various logic circuits including a plurality of inverters.

For example, when the first banks BANK 0 of the first and second bank groups BG1 and BG2 are classified as a bank having a high error frequency, the bank address BA<0> for selecting the first banks BANK0 of the first and second bank groups BG1 and BG2 may be inputted the bank controller BKCTRL, the enable signal generation circuit may generate the enabled scramble enable signal SE. Thus, the bank scrambler 420 may output the bank address BA<0> to the first bank group BG1 and may output the bank scrambler 420 to the second bank group BG2 in response to the enabled scramble signal SE. Therefore, errors might not be concentrated in testing by the banks.

Figure 14:
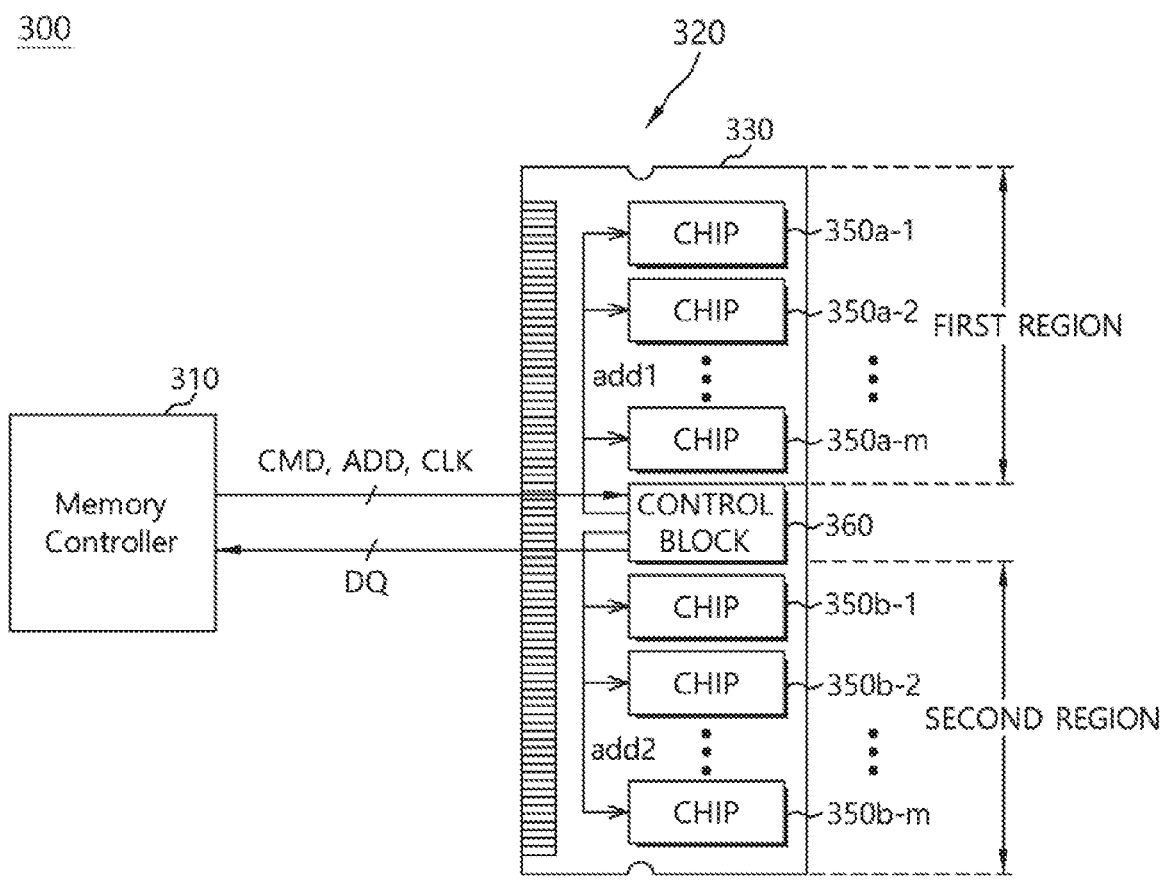
FIG. 14 is a view illustrating a semiconductor memory system in accordance with an example of an embodiment.

FIG. 14 is a view illustrating a semiconductor memory system in accordance with an example of an embodiment.

Referring to FIG. 14, a semiconductor memory system 300 of this example of an embodiment may include a memory controller 310 and a memory module 320.

The memory controller 310 may provide a semiconductor device in the memory module 320 with control signals such as commands CMD, addresses ADD, clock signals CLK, etc. The memory controller 310 may be interfaced with the memory module 320 to transmit data DQ to the memory module 320 or receive data DQ from the memory module 320.

The memory module 320 may include a module board 330, memory chips 350a-1~350a-m and 350b-1~350b-m, and a control block 360.

At least one of the memory chips 350a-1~350a-m and 350b-1~350b-m and the control block 360 may be mounted on the module board 330.

Each of the memory chips 350a-1~350a-m and 350b-1~350b-m may include a memory cell array. The memory cell array may include a DRAM cell or a resistive changeable memory cell.

Each of the memory chips 350a-1~350a-m and 350b-1~350b-m may include the banks in FIG. 12 including the memory cell array in FIG. 4.

The control block 360 may directly and/or indirectly control the memory chips 350a-1~350a-m and 350b-1~350b-m in view of a module.

The control block 360 may apply a first internal address add1 corresponding to the address ADD inputted from the memory controller 310 to the memory chips 350a-1~350a-m in a first region of the module board 330.

The control block 360 may apply a second internal address add2 corresponding to the address ADD inputted from the memory controller 310 to the memory chips 350b-1~350b-m in a second region of the module board 330.

When the first and second internal addresses add1 and add2 select the memory cell of the memory chips 350a-1~350a-m and 350b-1~350b-2, the second internal address add2 may correspond to a position obtained by inverting at least one bit of the first internal address add1. For example, the second internal address add2 may correspond to a position obtained by reversing in upward, downward, left and right directions a position of the memory cell directed by the first internal address add 1.

The first internal address add1 may correspond to the bank address BA<0:n> in FIGS. 12 and 13. The second internal address add2 may correspond to the scrambled bank address BA_C0:n>.

The control block 360 may include the address scrambler in FIG. 6, FIG. 9 or FIG. 13 to generate the first and second internal addresses add1 and add2.

In simultaneously testing the memory chips 350a-1~350a-m and 350b-1~350b-m on the module board 330, when the address ADD is inputted to select an adjacent memory cell or a bank having a high error generation ratio of each of the memory chips 350a-1~350a-m and 350b-1~350b-m, the control block 360 may output an internal address to select memory cells or banks located at positions reversed to each other of the memory chips 350a-1~350a-m in the first region and the memory chips 350b-1~350b-m in the second region so that error concentrations of the memory modules may be decreased.

FIG. 15 is a view illustrating a semiconductor memory system in accordance with an example of an embodiment.

Referring to FIG. 15, a semiconductor memory system 300-1 of this example of an embodiment may include first and second memory modules 320a and 320b.

Each of the first and second memory modules 320a and 320b may include memory chips 350a-1~350a-m and 350b-1~350b-m, and a control block 360.

The control block 360 of the first memory module 320a may generate a first internal address add1 corresponding to the address ADD provided from the memory controller 310 to control the memory chips 350a-1~350a-m of the first memory module 320a.

The control block 360 of the second memory module 320b may generate a second internal address add2 corresponding to the address ADD provided from the memory controller 310 to control the memory chips 350a-1~350a-m of the second memory module 320b.

When the first and second internal addresses add1 and add2 direct the memory cell, the second internal address add2 may correspond to a position obtained by inverting at least one bit of the first internal address add1. For example, the second internal address add2 may correspond to a position obtained by reversing in upward, downward, left and right directions a position of the memory cell directed by the first internal address add1.

Further, when the first internal address add1 may correspond to an address for selecting the bank having the high error generation ratio, the second internal address add2 may include a bit formed by reversing at least one of bits of the first internal address add1.

The control block 360 of the second memory module 320b may include the address scrambler in FIG. 6, FIG. 9 or FIG. 13 to generate the first and second internal addresses add1 and add2. The control block 360 of the second memory module 320b may receive the first internal address add1 from the first memory module 320a to generate the second internal address add2.

In simultaneously testing the memory modules 320a and 320b, when the address ADD is inputted to select an adjacent memory cell of each of the memory chips 350a-1~350a-m and 350b-1~350b-m, the control block 360 of each of the memory modules 320a and 320b may output an internal address to select memory cells located at positions reversed to each other of the memory chips 350a-1~350a-m in the first region and the memory chips 350b-1~350b-m in the second region so that error concentrations of the memory modules may be decreased.

The above described embodiments of the present disclosure are intended to illustrate and not to limit the present disclosure. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A semiconductor system comprising:
a first set of at least one semiconductor device;
a second set of at least one semiconductor device; and
a control block for receiving an external address and providing the first and second sets of semiconductor devices with an internal address,
wherein the control block provides a semiconductor device from the first set with a first internal address corresponding to the external address, and the control block provides a semiconductor device from the second set with a second internal address that does not correspond to the external address.

2. The semiconductor system of claim 1, wherein at least one of the semiconductor devices from each of the first and second sets comprise mats including a plurality of memory cells.

3. The semiconductor system of claim 1, wherein at least one of the semiconductor devices from each of the first and second sets comprise a plurality of banks.

4. The semiconductor system of claim 1, wherein at least one of the semiconductor devices from each of the first and second sets comprise a plurality of semiconductor chips.

5. The semiconductor system of claim 1, wherein the control block comprises an address scrambler configured for generating the first internal address in accordance with the external address, the address scrambler configured for outputting an address generated by inverting at least one bit of the first internal address as the second internal address in response to the first internal address and a scramble enable signal when the scramble enable signal is enabled, and the address scrambler configured to output the first internal address when the scramble enable signal is disabled.

6. The semiconductor system of claim 5, wherein the scramble enable signal is enabled when the external address corresponds to memory cell information or bank information having a high error frequency.

7. A semiconductor system comprising:
first and second mats; and
first and second control circuit blocks,
wherein each of the first and second mats comprise first to fourth sub-mats, and each of the first to fourth sub-mats comprise a plurality of word lines, a plurality of bit lines intersected with the word lines, and memory cells arranged between the word lines and the bit lines, and
wherein the first control circuit block is arranged between the first to fourth sub-mats of the first mat to output an internal address for selecting any one of the memory cells in the first to fourth sub-mats in response to an external address,
wherein the second control circuit block is arranged between the first to fourth sub-mats of the second mat to output the internal address for selecting any one of the memory cells in the first to fourth sub-mats in response to the external address, and
wherein the first and second control circuit blocks are configured to provide the first and second mats, respectively, with a first internal address, or the first control circuit block is configured to provide the first mat with the first internal address and the second control circuit block is configured to provide the second mat with a second internal address different from the first internal address.

8. The semiconductor system of claim 7,
wherein the first control circuit block comprises:
a first row decoder configured for activating any one of the word lines in the first mat;
a first column decoder configured for activating any one of the bit lines in the first mat; and
a first row address scrambler and a first column address scrambler, the first row and first column address scramblers configured to change an address of a selected word line and an address of a selected bit line, respectively, and
wherein the second control circuit block comprises:
a second row decoder configured for activating any one of the word lines in the second mat;
a second column decoder configured for activating any one of the bit lines in the second mat; and
a second row address scrambler and a second column address scrambler, the second row and second column address scramblers configured to change an address of a selected word line and an address of a selected bit line, respectively.

9. The semiconductor system of claim 8, wherein the first row address scrambler is configured to change a level of a first address bit of a row address, to classify the first to fourth sub-mats of the first mat into upper sub-mats and lower sub-mats with respect to the first control circuit block, in response to a mat selection signal.

10. The semiconductor system of claim 9, wherein the first address bit corresponds to an uppermost bit of the row address for selecting any one of the word lines in the first mat.

11. The semiconductor system of claim 9, wherein the first row address scrambler comprises:
a first logic gate for receiving a first mat selection signal for selecting the first mat and the first address bit, to output a first bit change signal for changing the first address bit of the row address in the first mat; and a second logic gate for receiving a second mat selection signal for selecting the second mat and the first address bit to output a second bit change signal for changing the first address bit of the row address in the second mat.

12. The semiconductor system of claim 8, wherein the first column address scrambler is configured to change a level of a second address bit of a column address, to classify the first to fourth sub-mats of the first mat into left sub-mats and right sub-mats with respect to the first control circuit block, in response to a mat selection signal.

13. The semiconductor system of claim 12, wherein the second address bit corresponds to an uppermost bit of the column address for selecting any one of the bit lines of the first mat.

14. The semiconductor system of claim 13, wherein the column address scrambler comprises:

a third logic gate for receiving a first mat selection signal for selecting the first mat and the second address bit to output a third bit change signal for changing the second address bit of the column address in the first mat; and a fourth logic gate for receiving a second mat selection signal for selecting the second mat and the second address bit to output a fourth bit change signal for changing the second address bit of the column address in the second mat.

15. A semiconductor chip comprising:

a bank controller;

a first bank group including a plurality of banks arranged at a first side of the bank controller; and a second bank group including a plurality of banks arranged at a second side of the bank controller opposite to the first side, wherein the bank controller provides the first and second bank groups with a bank address for selecting any one of the banks or provides the first bank group with the bank address and the second bank group with a scramble bank address different from the bank address.

16. The semiconductor chip of claim 15, wherein the bank controller comprises a bank scrambler for outputting a scramble bank address generated by inverting the bank address or any one of bits of the bank address in response to the bank address and a scramble enable signal.

17. A semiconductor memory system comprising:

a memory controller; and a memory module interfaced with the memory controller, the memory module including a plurality of semiconductor chips, wherein the memory module further comprises a control block for controlling the semiconductor chips, the control block generates a first internal address corresponding to an external address provided from the memory controller and a second internal address that do not correspond to the external address, and the control block provides a part of the semiconductor chips with the first internal address and the rest of the semiconductor chips with the second internal address in testing the semiconductor chips.

18. A semiconductor memory system comprising:

a memory controller; and first and second memory modules interfaced with the memory controller, the first and second memory modules including a plurality of semiconductor chips, wherein the first memory module further comprises a first control block for controlling the semiconductor chips in the first memory module, and the first control block generates a first internal address corresponding to an external address provided from the memory controller and transmits the first internal address to the semiconductor chips in the first memory module, and wherein the second memory module further comprises a second control block for controlling the semiconductor chips in the second memory module, and the second control block inverts the first internal address to generate a second internal address and transmits the second internal address to the semiconductor chips in the second memory module.

* * * * *